US011699686B2

(12) United States Patent
Yang et al.

(10) Patent No.: US 11,699,686 B2
(45) Date of Patent: Jul. 11, 2023

(54) DUAL-DIE SEMICONDUCTOR PACKAGE

(71) Applicant: NANYA TECHNOLOGY CORPORATION, New Taipei (TW)

(72) Inventors: Wu-Der Yang, Taoyuan (TW);
Chun-Huang Yu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/685,528

(22) Filed: Mar. 3, 2022

(65) Prior Publication Data

US 2022/0189927 A1 Jun. 16, 2022

Related U.S. Application Data

(62) Division of application No. 16/832,305, filed on Mar. 27, 2020.

(51) Int. Cl.
*H01L 25/065* (2023.01)
*H01L 23/498* (2006.01)
*H01L 21/56* (2006.01)
*H01L 23/00* (2006.01)
*H01L 25/00* (2006.01)
*H01L 23/31* (2006.01)

(52) U.S. Cl.
CPC .......... *H01L 25/0657* (2013.01); *H01L 21/56* (2013.01); *H01L 23/3128* (2013.01); *H01L 23/49816* (2013.01); *H01L 23/49861* (2013.01); *H01L 24/13* (2013.01); *H01L 25/50* (2013.01)

(58) Field of Classification Search
CPC . H01L 25/0657; H01L 21/56; H01L 23/3128; H01L 23/49816; H01L 23/49861; H01L 24/13; H01L 25/50; H01L 25/0652; H01L 25/0655; H01L 25/18; H10B 80/00
See application file for complete search history.

(56) References Cited

U.S. PATENT DOCUMENTS 6,229,215 B1 * 5/2001 Egawa ................ H01L 25/0657
257/E21.503

* cited by examiner

*Primary Examiner* — Jasmine J Clark
(74) *Attorney, Agent, or Firm* — Xuan Zhang

(57) ABSTRACT

The present application provides a semiconductor package and a manufacturing method thereof. The semiconductor package includes a package substrate, a bottom device die, an interposing package substrate and a top device die. The bottom device die is bonded to the package substrate. The interposing package substrate is located over the bottom device die and bonded to the package substrate. The top device die is bonded to the interposing package substrate form above the interposing package substrate.

11 Claims, 20 Drawing Sheets

DUAL-DIE SEMICONDUCTOR PACKAGE

CROSS-REFERENCE TO RELATED APPLICATION

This application is a divisional application of U.S. Non-Provisional application Ser. No. 16/832,305 filed Mar. 27, 2020, now U.S. Pat. No. 11,469,216, which is incorporated herein by reference in its entirety.

TECHNICAL FIELD

The present disclosure relates to a semiconductor package, and more particularly, to a dual-die semiconductor package.

DISCUSSION OF THE BACKGROUND

The semiconductor industry has experienced continuous growth due to constant improvement in integration density of various electronic components. This improvement has been primarily based on repeated reductions in minimum feature size, allowing more components to be integrated into a given chip area.

Such integration improvement is essentially two-dimensional (2D) in nature, in that the volume occupied by the integrated components is essentially on the surface of semiconductor wafer. Although dramatic improvements in lithography have resulted in considerable improvement in 2D integrated circuit formation, there are physical limitations to the density that can be achieved in two dimensions. While 2D scaling remains an option for new designs, adopting three-dimensional (3D) packaging schemes that utilize the z-direction has become a focus of research in the industry. In a 3D package structure, multiple semiconductor dies are stacked on one another. Consequently, a signal path between an upper semiconductor die and inputs/outputs (I/Os) of the 3D package structure is longer than a signal path between a lower semiconductor die and the I/Os, thus signal transmission time of the upper semiconductor die may be delayed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a semiconductor package is provided. The semiconductor package comprises: a package substrate; a bottom device die, bonded to the package substrate; an interposing package substrate, located over the bottom device die and bonded to the package substrate; and a top device die, bonded to the interposing package substrate from above the interposing package substrate.

In some embodiments, the package substrate is bonded with a peripheral portion of the interposing package substrate.

In some embodiments, the interposing package substrate is vertically spaced apart from the bottom device die.

In some embodiments, the semiconductor package further comprises a plurality of electrical connectors configured to connect a peripheral portion of the interposing package substrate and the package substrate.

In some embodiments, the bottom device die is located between laterally separated ones of the electrical connectors.

In some embodiments, the electrical connectors are laterally spaced apart from the bottom device die.

In some embodiments, a height of the electrical connectors is greater than a height measured from a top surface of the bottom device die to a top surface of the package substrate.

In some embodiments, the electrical connectors are ball-grid-array (BGA) balls or controlled-collapse-chip-connection (C4) bumps.

In some embodiments, the semiconductor package further comprises an encapsulant encapsulating the bottom device die, the interposing package substrate, and the top device die.

In some embodiments, a space between the bottom device die and the interposing package substrate is filled by the encapsulant.

In some embodiments, the semiconductor package further comprises additional electrical connectors disposed at a bottom side of the package substrate.

In some embodiments, the semiconductor package further comprises first conductive pillars disposed between the bottom device die and the package substrate; and second conductive pillars disposed between the top device die and the interposing package substrate.

In another aspect of the present disclosure, a semiconductor package is provided. The semiconductor package comprises: a package substrate; a bottom device die, bonded to the package substrate; an interposing package substrate, located over the bottom device die, wherein a peripheral portion of the interposing package substrate is bonded to the package substrate, and a footprint area of the interposing package substrate is larger than a footprint area of the bottom device die and smaller than a footprint area of the package substrate; and a top device die, bonded onto the interposing package substrate.

In some embodiments, the footprint area of the interposing package substrate is larger than a footprint area of the top device die.

In yet another aspect of the present disclosure, a manufacturing method of a semiconductor package is provided. The manufacturing method of the semiconductor package comprises: bonding a bottom device die onto a package substrate; bonding a top device die onto an interposing package substrate; and bonding the interposing package substrate along with the top device die onto the package substrate, wherein the bonded interposing package substrate is located between the bottom device die and the top device die.

In some embodiments, the manufacturing method of the semiconductor package further comprises: forming electrical connectors at a bottom side of the interposing package substrate before bonding the interposing package substrate to the package substrate In some embodiments, the electrical connectors are formed as laterally surrounding an open area, and the bottom device die is located in the open area when the interposing package substrate is bonded to the package substrate.

In some embodiments, the manufacturing method of the semiconductor package further comprises: encapsulating the bottom device die, the interposing package substrate and the top device die with an encapsulant after the interposing package substrate is bonded to the package substrate.

In some embodiments, the interposing package substrate is laterally surrounded by a portion of the encapsulant.

In some embodiments, a space between the bottom device die and the interposing package substrate is filled by the encapsulant.

By disposing the interposing package substrate, additional power plane and additional ground plane can be provided to the top device die. As compared to the power plane and ground plane formed in the package substrate, these additional power plane and ground plane in the interposing package substrate are closer to the top device die. Therefore, power and reference voltages can be provided to the top device die by the interposing package substrate with fewer loss. Accordingly, performance of the top device die can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
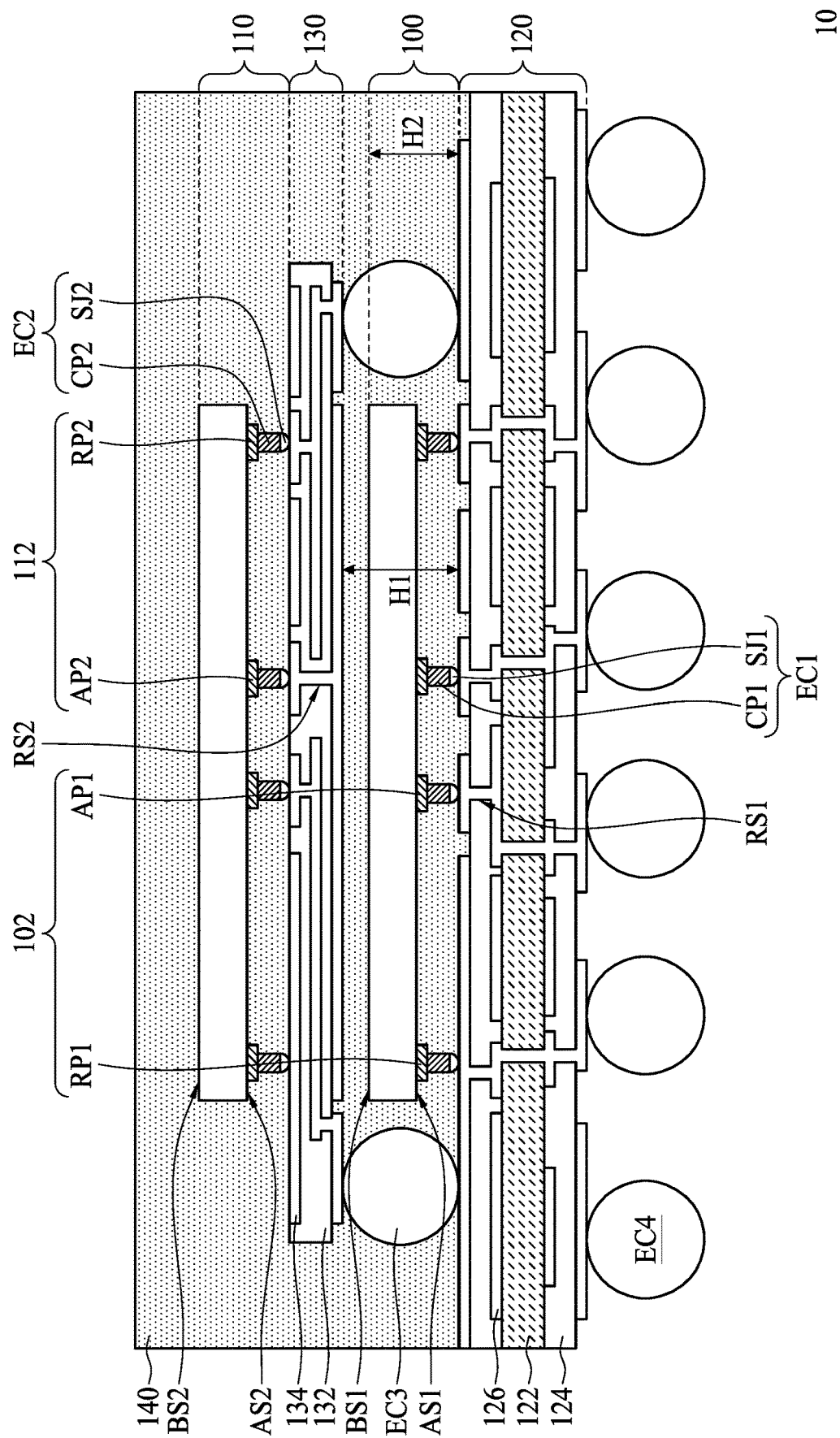
FIG. 1 is a schematic cross-sectional view illustrating a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
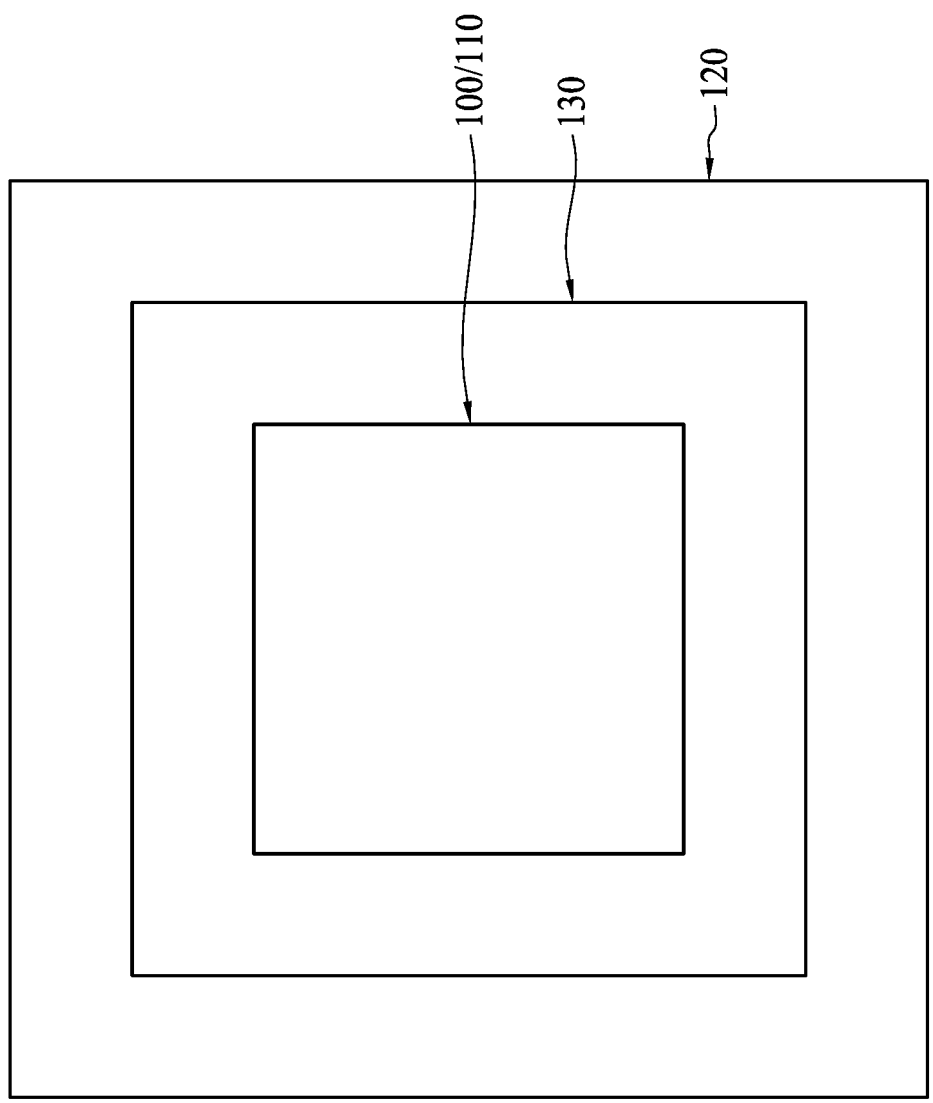
FIG. 2A is a schematic top view of the semiconductor package as shown in FIG. 1.
Figure 2B:
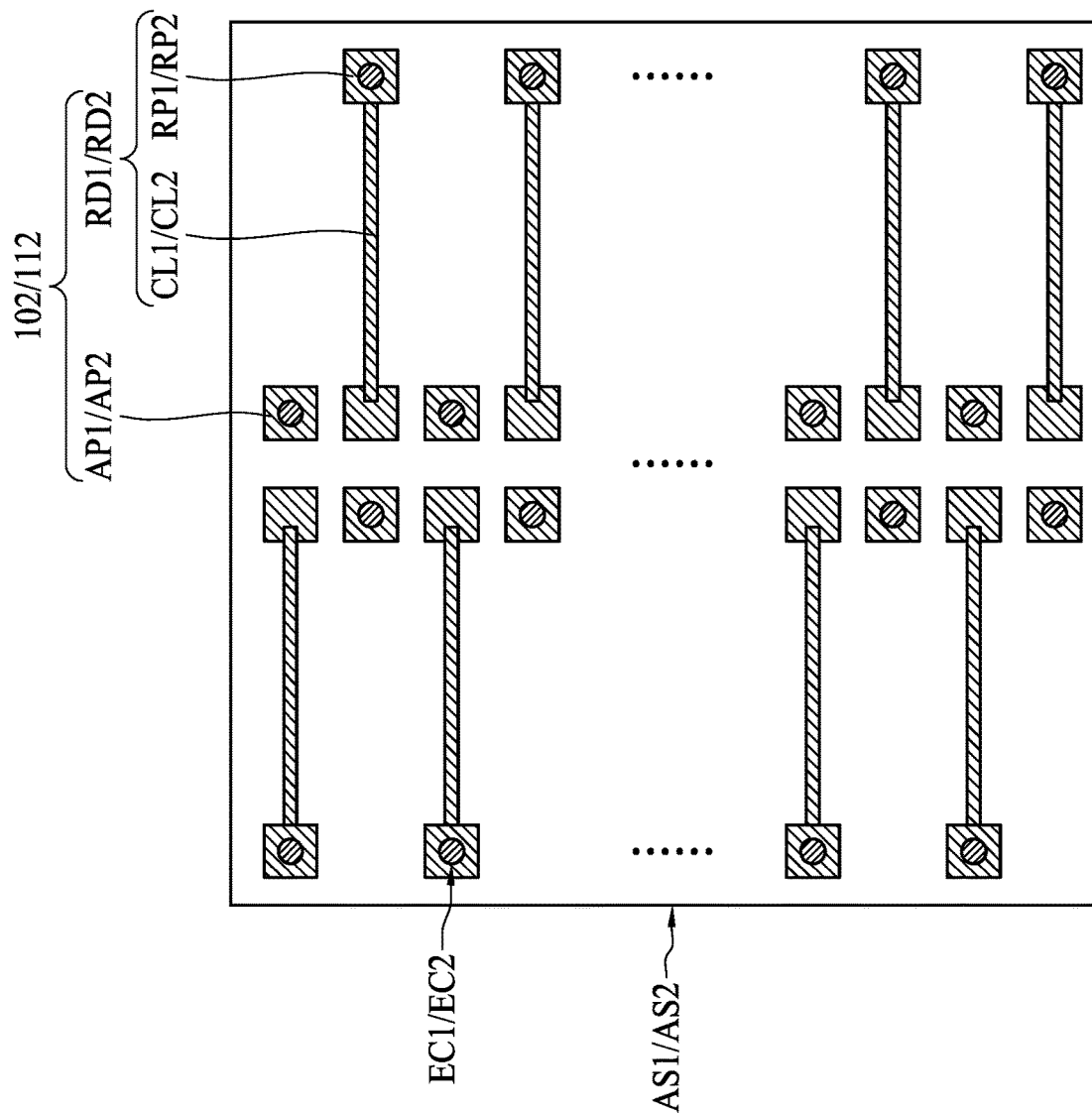
FIG. 2B is a schematic plan view illustrating an active side of each device die in the semiconductor package as shown in FIG. 1.

FIG. 1 is a schematic cross-sectional view illustrating a semiconductor package 10 according to some embodiments of the present disclosure. FIG. 2A is a schematic top view of the semiconductor package 10 as shown in FIG. 1. FIG. 2B is a schematic plan view illustrating an active side of each device die in the semiconductor package 10 as shown in FIG. 1.

Referring to FIG. 1, in some embodiments, the semiconductor package 10 is a dual die semiconductor package. In these embodiments, the semiconductor package 10 includes a bottom device die 100 and a top device die 110 located over the bottom device die 100. The bottom device die 100 and the top device die 110 are bonded to a package substrate 120. In some embodiments, an active side AS1 of the bottom device die 100 and an active side AS2 of the top device die 110 face toward the package substrate 120, while a back side BS1 of the bottom device die 100 and a back side BS2 of the top device die 110 face away from the package substrate 120. The active side AS1/AS2 of a device die 100/110 is referred as a side on which die inputs/outputs (I/Os) 102/112 are disposed. In some embodiments, the die I/Os 102 of the bottom device die 100 include conductive pads AP1, and the die I/Os 112 of the top device die 110 include conductive pads AP2. The conductive pads AP1/AP2 are electrically connected to an integrated circuit in the device die 100/110. For instance, the integrated circuit includes active devices and/or passive devices (not shown), and includes interconnections (also not shown) for routing the active and/or passive devices. The conductive pads AP1/AP2 may be connected to the active/passive devices through the interconnections. In some embodiments, the bottom device die 100 and the top device die 110 are memory dies, such as dynamic random access memory (DRAM) dies. In these embodiments, the integrated circuit in each of the bottom device die 100 and the top device die 110 may include an array of memory cells each including at least one access transistor and at least one storage capacitor. In addition, the top device die 110 may be substantially identical to the bottom device die 100 in terms of circuits and dimension. Alternatively, the top device die 110 and the bottom device die 100 may be different from each other in terms of circuits, dimension or other characteristics.

In some embodiments, the semiconductor package 10 further includes an interposing package substrate 130. The interposing package substrate 130 is disposed between the bottom device die 100 and the top device die 110. The top device die 110 is bonded to the interposing package substrate 130, and the interposing package substrate 130 is bonded to the package substrate 120. In other words, the top device die 110 is not directly bonded to the package substrate 120, but bonded to the package substrate 120 with the interposing package substrate 130 in between. As shown in FIG. 2A, a footprint area of the interposing package substrate 130 may be greater than a footprint area of the bottom device die 100, but smaller than a footprint area of the package substrate 120. In this way, a peripheral portion of the interposing package substrate 130 is outside a span of the bottom device die 100, and the interposing package substrate 130 can be bonded to the package substrate 120 via this peripheral portion (as shown in FIG. 1). In those embodiments where the bottom device die 100 and the top device die 110 are identical to each other in terms of dimension, the footprint area of the interposing package substrate 130 is greater than a footprint area of the top device die 110 as well. In some embodiments, as shown in FIG. 1, the interposing package substrate 130 is vertically spaced apart from the bottom device die 100. In these embodiments, the bottom device die 100 is not in direct contact with the interposing package substrate 130.

In some embodiments, the bottom device die 100 are bonded to the package substrate 120 through electrical connectors EC1. The electrical connectors EC1 connect the die I/Os 102 of the bottom device die 100 to the package substrate 120. In some embodiments, the electrical connectors EC1 respectively include a conductive pillar CP1 and a solder joint SJ1. A terminal of the conductive pillar CP1 is connected to one of the die I/Os 102, and the other terminal of the conductive pillar CP1 is connected to the package substrate 120 through the solder joint SJ1. As similar to the bottom device 100, the top device die 110 may be bonded to the interposing package substrate 130 through electrical connectors EC2. The electrical connectors EC2 connect the die I/Os 112 of the top device die 110 to the interposing package substrate 130. In some embodiments, the electrical connectors EC2 respectively include a conductive pillar CP2 and a solder joint SJ2. A terminal of the conductive pillar CP2 is connected to one of the die I/Os 112, and the other terminal of the conductive pillar CP2 is connected to the interposing package substrate 130 through the solder joint SJ2. In some embodiments, a material of the conductive pillars CP1, CP2 may include metal (e.g., copper or copper alloy), while the solder joints SJ1, SJ2 may be made of a solder material. In addition, the electrical connectors EC1, EC2 may respectively have a height in a range from 30 μm to 150 μm. However, those skilled in the art may select other suitable materials for the electrical connectors EC1, EC2 and/or modify dimensions of the electrical connectors EC1, EC2 according to design needs, the present disclosure is not limited thereto.

In some embodiments, the interposing package substrate 130 is bonded to the package substrate 120 through electrical connectors EC3. In some embodiments, the electrical connectors EC3 may be ball-grid-array (BGA) balls, controlled-collapse-chip-connection (C4) bumps or the like. The electrical connectors EC3 may be in contact with a peripheral portion of the interposing package substrate 130 outside the span of the bottom device die 100, such that the bottom device die 100 can be laterally surrounded by the electrical connectors EC3. Alternatively, the electrical connectors EC3 may be disposed at opposite sides of the bottom device die 100. In some embodiments, the electrical connectors EC3 are laterally spaced apart from the bottom device die 100. In those embodiments where the interposing package substrate 130 is vertically spaced apart from the bottom device die 100, a height H1 of the electrical connectors EC3 is greater than a total height H2 of the bottom device die 100 and the electrical connectors EC1. In some embodiments, a ratio of the height H1 with respect to the height H2 may range from 1.04 to 3.5. As an example, the height H1 may range from 250 μm to 350 μm, while the height H2 may be in a range from 100 μm to 240 μm.

In some embodiments, the package substrate 120 is a package substrate with a dielectric core layer 122. In these embodiments, the package substrate 120 includes the dielectric core layer 122, and includes built-up dielectric layers 124 and layers of conductive patterns 126 alternately formed at opposite sides of the dielectric core layer 122. As shown in FIG. 1, the built-up dielectric layers 124 and the layers of the conductive patterns 126 may be alternately stacked at a top side and a bottom side of the dielectric core layer 122. The layers of the conductive patterns 126 may include at least one layer of ground plane, at least one layer of power plane and at least one layer of signal plane. For instance, two signal planes span between a ground plane and a power plane. In addition, the package substrate 120 may further include routing structures RS1 for routing the electrical connectors EC1, EC3 on the package substrate 120 to some layers of the conductive patterns 126 in the package substrate 120, and to package I/Os EC4 formed at a bottom side of the package substrate 120. The routing structures RS1 may include conductive traces, conductive vias and through vias. The conductive traces respectively extend on a surface of one of the built-up dielectric layers 124 or a surface of the dielectric core layer 122. The conductive vias respectively penetrate one or more of the built-up dielectric layers 124, and are electrically connected to one or more of the conductive traces and/or one of the layers of the conductive patterns 126. In addition, the through vias penetrate through the dielectric core layer 122, and are configured to establish electrical connection between portions of the routing structures RS1 at opposite sides of the dielectric core layer 122. In some embodiments, the topmost layer of the conductive patterns 126 and the topmost portions of the routing structures RS1 are in contact with the electrical connectors EC1, EC2, while the bottommost layer of the conductive patterns 126 and the bottommost portions of the routing structures RS1 are in contact with the package I/Os EC4. The package I/Os EC4 may be BGA balls, C4 bumps or the like, and may have a dimension greater than, substantially identical to or less than a dimension of the electrical connectors EC3.

In some embodiments, the interposing package substrate 130 is a core-less package substrate. In these embodiments, the interposing package substrate 130 includes alternately stacked built-up dielectric layers 132 and layers of conductive patterns 134. As similar to the layers of the conductive patterns 126 in the package substrate 120, the layers of the conductive patterns 134 in the interposing package substrate 130 may include at least one layer of ground plane, at least one layer of power plane and at least one layer of signal plane. Since the package substrate 120 is configured to transmit signals from/to both of the bottom device die 100 and the top device die 110, while the interposing package substrate 130 is configured to transmit signals merely from/to the top device die 110, the interposing package substrate 130 may have fewer signal plane(s) than the package substrate 120. For instance, a single signal plane spans between a ground plane and a power plane in the interposing package substrate 130, while two signal planes may be included in the package substrate 120. Moreover, as similar to the package substrate 120, the interposing package substrate 130 may include routing structures RS2 for routing the electrical connectors EC2 on the interposing package substrate 130 to some layers of the conductive patterns 134 in the interposing package substrate 130, and to the electrical connectors EC3 disposed at a bottom side of the interposing package substrate 130. The routing structures RS2 may include conductive traces and conductive vias. The conductive traces respectively extend on a surface of one of the built-up dielectric layers 132, while the conductive vias respectively penetrate through one or more of the built-up dielectric layers 132 and electrically connect to one or more of the conductive traces and/or one of the layers of the conductive patterns 134.

In other embodiments, each of the package substrate 120 and the interposing package substrate 130 is a core-less package substrate. In yet other embodiments, each of the package substrate 120 and the interposing package substrate 130 is a package substrate with a dielectric core layer. Alternatively, the package substrate 120 is a core-less package substrate, while the interposing package substrate 130 is a package substrate with a dielectric core layer. The package substrate having a dielectric core layer, which is made of a rigid material, may have improved mechanical strength, while the core-less package substrate may have advantages such as light weight and low z-height. Those skilled in the art may select suitable substrate type(s) for the package substrate 120 and the interposing package substrate 130 according to process requirements, the present disclosure is not limited thereto.

In some embodiments, the semiconductor package 10 further includes an encapsulant 140. The encapsulant 140 encapsulates the components bonded on the package substrate 120. In other words, the bottom device die 100, the top device die 110, the interposing package substrate 130 and the electrical connectors EC1, EC2, EC3 are encapsulated by the encapsulant 140. In some embodiments, the components bonded on the package substrate 120 is over-molded by the encapsulant 140. In such embodiments, a top surface of the top device die 110 (e.g., the back side BS2) is covered by a top portion of the encapsulant 140. In addition, in some embodiments, a sidewall of the encapsulant 140 is substantially coplanar with a sidewall of the package substrate 120. The encapsulant 140 includes a molding compound, such as epoxy resin. In some embodiments, the encapsulant 140 further includes filler particles (not shown) dispersed in the molding compound. The filler particles may be made of an inorganic material (e.g., silica), and are configured to modify a material property of the encapsulant 140 (e.g., coefficient of thermal expansion (CTE)).

Referring to FIG. 1 and FIG. 2B, in some embodiments, the die I/Os 102 of the bottom device die 100 further include redistribution structures RD1. In embodiments where the conductive pads AP1 are formed within a central region of the active side AS1 of the bottom device die 100, some of the conductive pads AP1 are routed to a peripheral region of the active side AS1 by the redistribution structures RD1. In this way, the die I/Os 102 of the bottom device die 100 can be distributed within both of the central region and the peripheral region of the active side AS1 of the bottom device die 100. As an example, the conductive pads AP1 may be arranged in two columns within the central region, and the conductive pads AP1 in each column are alternately connected to the redistribution structure RD1 extending to the peripheral region. However, those skilled in the art may modify configuration of the conductive pads AP1 and the redistribution structures RD1 according to design needs, as long as the die I/Os 102 of the bottom device die 100 can be distributed within both of the central region and the peripheral region of the active side AS1 of the bottom device die 100. In some embodiments, the redistribution structures RD1 respectively include a conductive line CL1 and a redistribution pad RP1. It should be noted that, only the redistribution pads RP1 of the redistribution structures RD1 are depicted in FIG. 1, the conductive lines CL1 are omitted from illustration in FIG. 1. On the other hand, the conductive lines CL1 and the redistribution pads RP1 are both shown in FIG. 2A. The conductive line CL1 extends from one of the conductive pads AP1 to one of the redistribution pads RP1. In some embodiments, the conductive line CL1 extends from a surface of the corresponding conductive pad AP1 exposed at the active side AS1, and is in lateral contact with the corresponding redistribution pad RP1. The conductive line CL1 may be formed as a straight line. Alternatively, the conductive line CL1 may have at least one turn along its extending direction. In addition, the electrical connectors EC1 may be formed on the redistribution pads RP1 as well as the conductive pads AP1 not connected to the redistribution structures RD1.

As similar to the description of the bottom device die 100, the die I/Os 112 of the top device die 110 may further include redistribution structures RD2. In some embodiments, the redistribution structures RD2 respectively include a conductive line CL2 and a redistribution pad RP2. The conductive line CL2 is connected between one of the conductive pads AP2 and one of the redistribution pads RP2. The electrical connectors EC2 may be formed on the redistribution pads RP2 as well as the conductive pads AP2 not connected to the redistribution structures RD1. A configuration of the conductive pads AP2 and the redistribution structures RP2 may be identical to or different from a configuration of the conductive pads AP1 and the redistribution structures RD1, as long as the die I/Os 112 of the top device die 110 can be distributed within both of a central region and a peripheral region of the active side AS2 of the top device die 110.

In alternative embodiments, the redistribution structures RD1 and/or the redistribution structures RD2 are omitted. In these alternative embodiments, the die I/Os 102 of the bottom device die 100 and/or the die I/Os 112 of the top device die 110 only include the conductive pads AP1/AP2.

As described above, the semiconductor package 10 according to some embodiments of the present disclosure is a dual die semiconductor package, and includes the bottom device die 100 and the top device die 110 located over the bottom device die 100. The bottom device die 100 is bonded to the package substrate 120. The top device die 110 is bonded to the package substrate 120 with the interposing package substrate 130 in between. The interposing package substrate 130 is located between the bottom device die 100 and the top device die 110. In addition, the interposing package substrate 130 may be bonded to the package substrate by a peripheral portion, thus the electrical connectors EC3 for connecting the interposing package substrate 130 to the package substrate 120 laterally surround the bottom device die 100. By disposing the interposing package substrate 130, additional power plane and additional ground plane can be provided to the top device die 110. As compared to the power plane and ground plane formed in the package substrate 120, these additional power plane and ground plane in the interposing package substrate 130 are closer to the top device die 110. Therefore, power and reference voltages can be provided to the top device die 110 by the interposing package substrate with fewer loss. Accordingly, performance of the top device die 110 can be improved.

Figure 3:
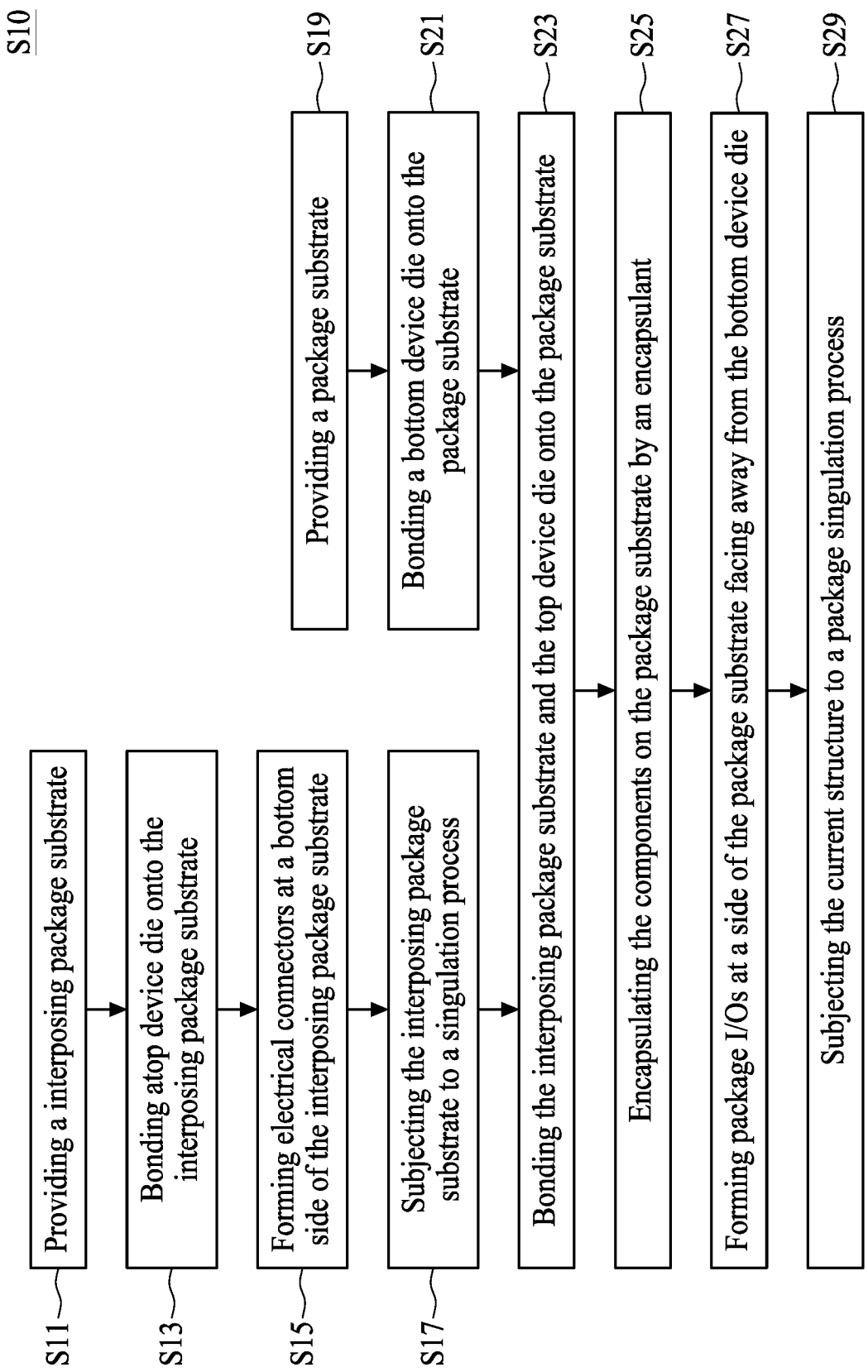
FIG. 3 is a flow diagram of a manufacturing method for forming the semiconductor package shown in FIG. 1.

FIG. 3 is a flow diagram of a manufacturing method S10 for forming the semiconductor package 10 shown in FIG. 1. FIG. 4A through FIG. 4I are schematic cross-sectional views illustrating structures at various stages during the manufacturing process of the semiconductor package shown in FIG. 1.

Figure 4A:
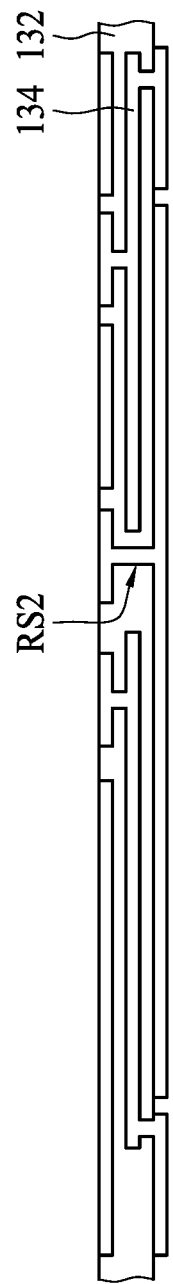
FIG. 4A through FIG. 4I are schematic cross-sectional views illustrating structures at various stages during the manufacturing process of the semiconductor package shown in FIG. 1.

Referring to FIG. 3 and FIG. 4A, step S11 is performed, and the interposing package substrate 130 is provided. In those embodiments where the interposing package substrate 130 is a core-less package substrate, the built-up dielectric layers 132, the layers of the conductive patterns 134 and the routing structures RS2 are formed on a carrier (not shown). Afterwards, the carrier is removed, and the remained structure forms the interposing package substrate 130. A method for forming each of the built-up dielectric layers 132 may include a lamination process. In addition, a method for forming each layer of the conductive patterns 134 may include a lithography process as well as a plating process or a deposition process. In some embodiments, a portion of the routing structures RS2 may be formed along with formation of one of the layers of the conductive patterns 134. The built-up dielectric layers 132 may be composed of a polymer material, while the conductive patterns 134 and the routing structures RS2 may be composed of a metallic material. In those embodiments where the interposing substrate 130 is a package substrate with a dielectric core layer, a method for forming such package substrate may be similar to a method for forming the package substrate 120 as will be described with reference to FIG. 4E.

Figure 4B:
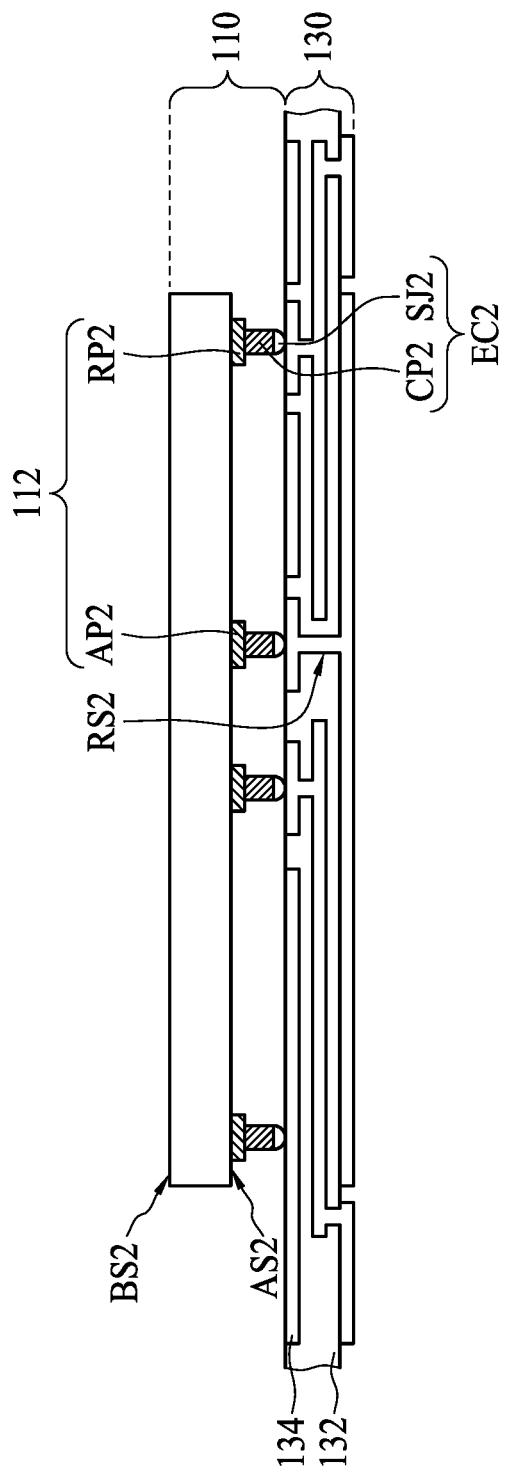

Referring to FIG. 3 and FIG. 4B, step S13 is performed, and the top device die 110 is bonded onto the interposing package substrate 130 through the electrical connectors EC2. In some embodiments, the electrical connectors EC2 are pre-formed on the die I/Os 112 of the top device die 110. After the top device die 110 is bonded onto the interposing package substrate 130, the electrical connectors EC2 may be in contact with the topmost layer of the conductive patterns 134 and the topmost portions of the routing structures RS2 in the interposing package substrate 130, and electrical connection between the top device die 110 and the conductive patterns 134 in the interposing package substrate 130 can be established. In some embodiments, a pick and place process is used for attaching the top device die 110 to the interposing package substrate 130. In addition, a thermal treatment may be subsequently performed for bonding the top device die 110 to the interposing package substrate 130.

Figure 4C:
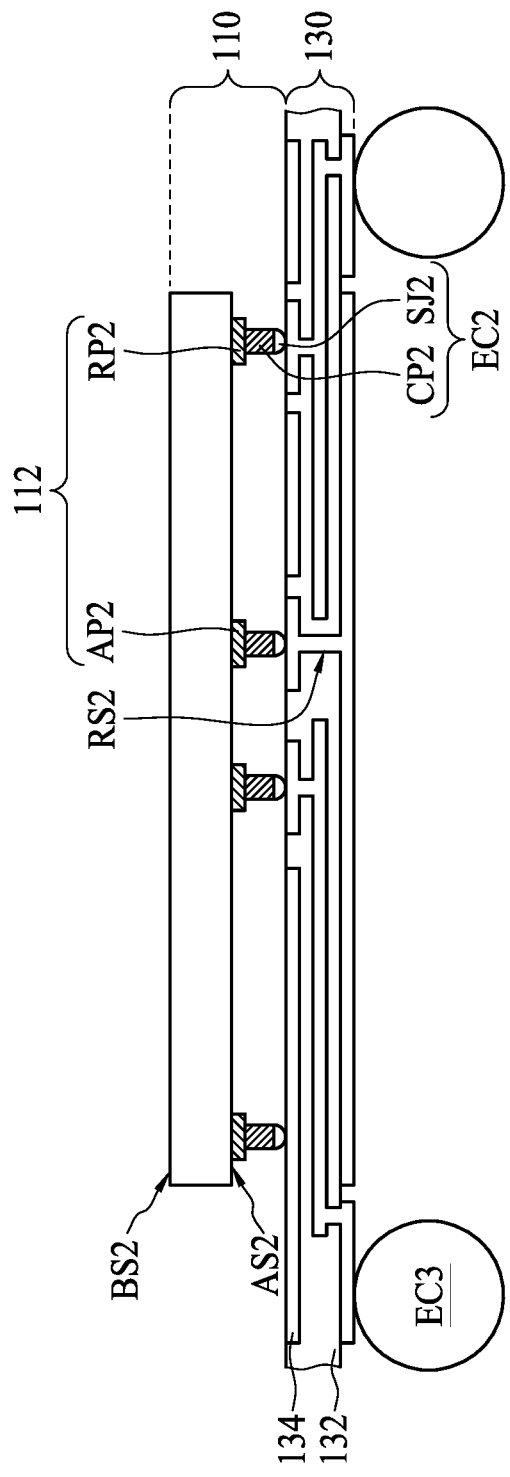

Referring to FIG. 3 and FIG. 4C, step S15 is performed, and the electrical connectors EC3 are formed at a bottom side of the interposing package substrate 130. The electrical connectors EC3 are in contact with the bottommost layer of the conductive patterns 134 and the bottommost portions of the routing structures RS2 in the interposing package substrate 130. In some embodiments, the electrical connectors EC3 are arranged around an open area in which the bottom device die 100 can be accommodated after the interposing package substrate 130 is bonded onto the package substrate 120 (as will be described with reference to FIG. 4G). In those embodiments where the electrical connectors EC3 are BGA balls, a method for forming the electrical connectors EC3 may include a ball placement process or a ball mount process.

Figure 4D:
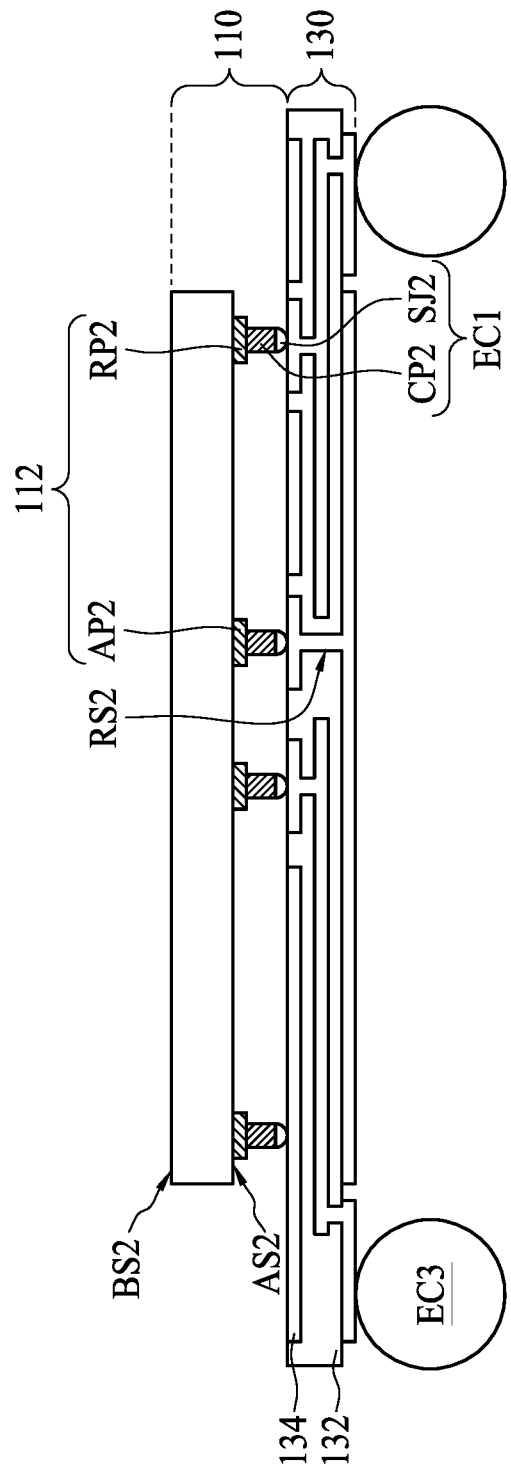

Referring to FIG. 3 and FIG. 4D, step S17 is performed, and the interposing package substrate 130 is subjected to a singulation process. One of the singulated structures is depicted as the interposing package substrate 130 in FIG. 4D. In some embodiments, the singulation process may include a blade sawing process, a plasma dicing process or the like.

It should be noted that, in the embodiments as described with reference to FIG. 4C and FIG. 4D, formation of the electrical connectors EC3 is followed by the singulation process. However, in alternative embodiments, the singulation process may precede the formation of the electrical connectors EC3. The present disclosure is not limited to the sequential order of the steps S15, S17.

Figure 4E:
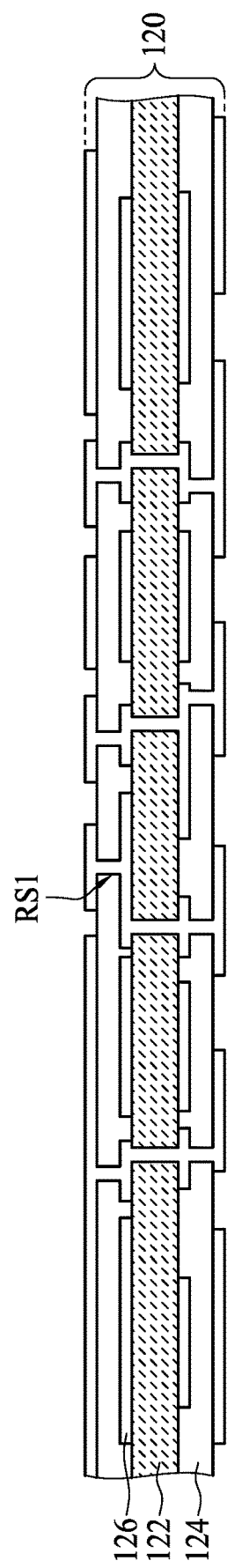

Referring to FIG. 3 and FIG. 4E, step S19 is performed, and the package substrate 120 is provided. In those embodiments where the package substrate 120 is a package substrate with the dielectric core layer 122, the built-up dielectric layers 124 and the layers of the conductive patterns 126 are formed at opposite sides of the dielectric core layer 122. In addition, the conductive vias and conductive traces of the routing structures RS1 are formed along with the layers of the conductive patterns 126, and the through vias of the routing structures RS1 may be formed in the dielectric core layer 122. In some embodiments, a method for forming each built-up dielectric layer 124 includes a lamination process, and a method for forming each layer of the conductive patterns 126 include a lithography process as well as a plating process or a deposition process. In addition, in some embodiments, a method for forming the through vias of the routing structures RS1 includes forming through holes in the dielectric core layer 122 by a drilling process (e.g., a laser drilling process), and filling a conductive material into these through holes to form the through vias by a plating process or a deposition process. In those embodiments where the package substrate 120 is a core-less package substrate, a method for forming such package substrate may be similar to the method for forming the interposing package substrate 130 as described with reference to FIG. 4A.

Figure 4F:
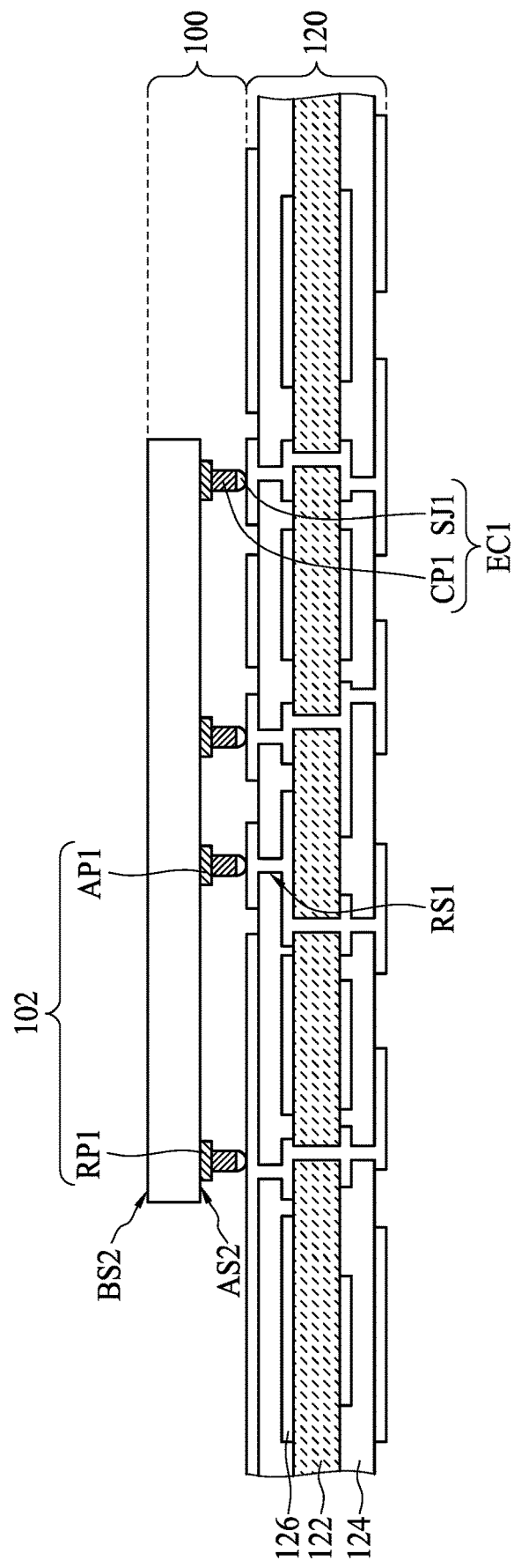

Referring to FIG. 3 and FIG. 4F, step S21 is performed, and the bottom device die 100 is bonded onto the package substrate 120 through the electrical connectors EC1. In some embodiments, the electrical connectors EC1 are pre-formed on the die I/Os 102 of the bottom device die 100. After the bottom device die 100 is bonded onto the package substrate 120, the electrical connectors EC1 may be in contact with the topmost layer of the conductive patterns 126 and the topmost portions of the routing structures RS1 in the package substrate 120, and electrical connection between the bottom device die 100 and the conductive patterns 126 in the package substrate 120 can be established. In some embodiments, a pick and plane process is used for attaching the bottom device die 100 to the package substrate 120. In addition, a thermal treatment may be subsequently performed for bonding the bottom device die 100 to the package substrate 120.

In some embodiments, the steps for preparing the structure including the interposing package substrate 130 and the top device die 110 (e.g., the steps S11, S13, S15, S17) precede the steps for preparing the structure including the package substrate 120 and the bottom device die 100 (e.g., the steps S19, S21). However, in alternative embodiments, the steps for preparing the structure including the package substrate 120 and the bottom device die 100 (e.g., the steps S19, S21) is followed by the steps for preparing the structure including the interposing package substrate 130 and the top device die 110 (e.g., the steps S11, S13, S15, S17). The present disclosure is not limited to a sequential order of these two groups of steps.

Figure 4G:
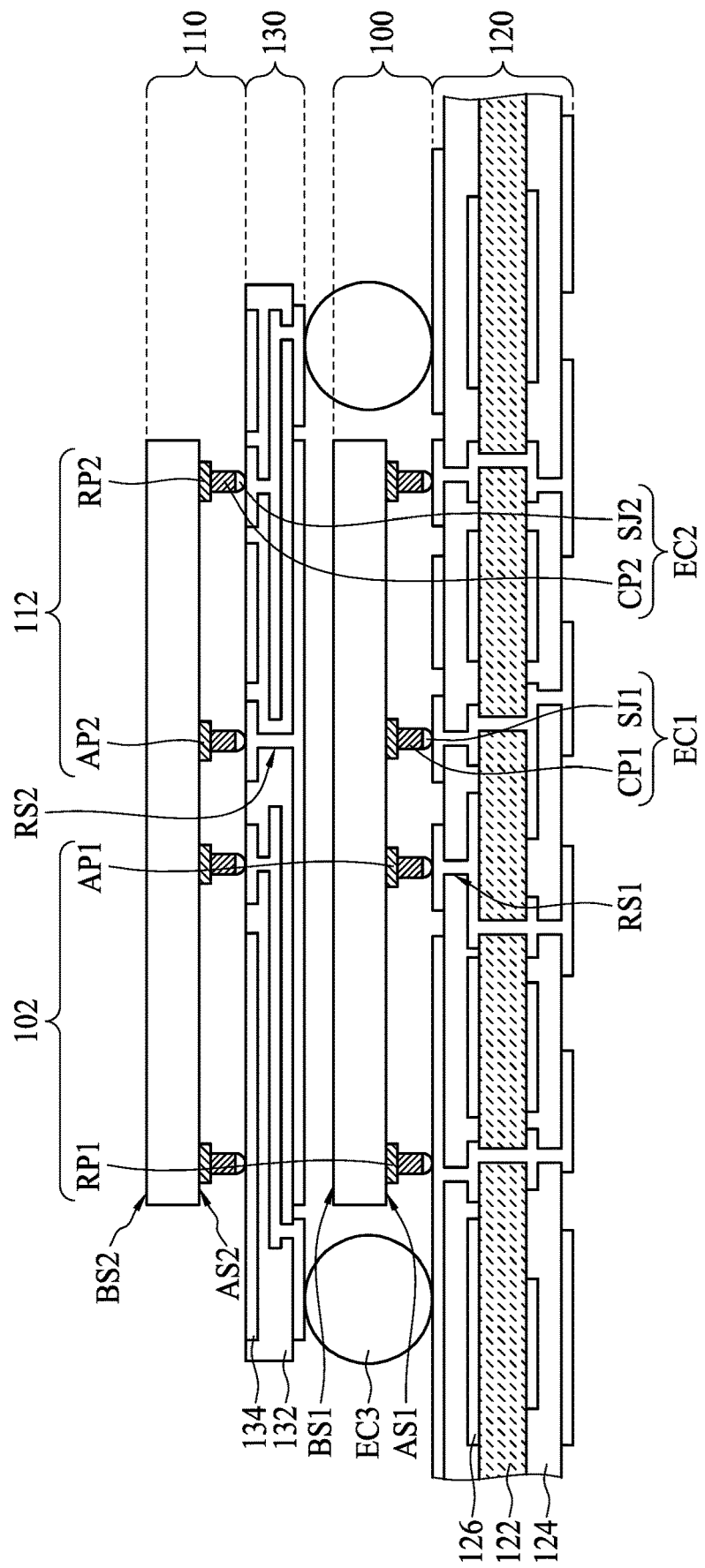

Referring to FIG. 3 and FIG. 4G, step S23 is performed, and the interposing package substrate 130 as well as the top device die 110 are bonded to the package substrate 120 through the electrical connectors EC3. After the electrical connectors EC3 are bonded to the package substrate 120, the electrical connectors EC3 may be in contact with the topmost layer of the conductive patterns 126 and the topmost portions of the routing structures RS1, and electrical connection between the interposing package substrate 130 and the package substrate 120 can be established. In some embodiments, a pick and place process is used for attaching the interposing package substrate 130 bonded with the top device die 110 to the package substrate 120. In addition, a thermal treatment may be subsequently performed for bonding the interposing package substrate 130 to the package substrate 120. In some embodiments, prior to the attachment of the interposing package substrate 130 and the package substrate 120, the open area laterally surrounded by the electrical connectors EC3 is positioned over the bottom device die 100, such that the attached electrical connectors EC3 can laterally surround the bottom device die 100.

Figure 4H:
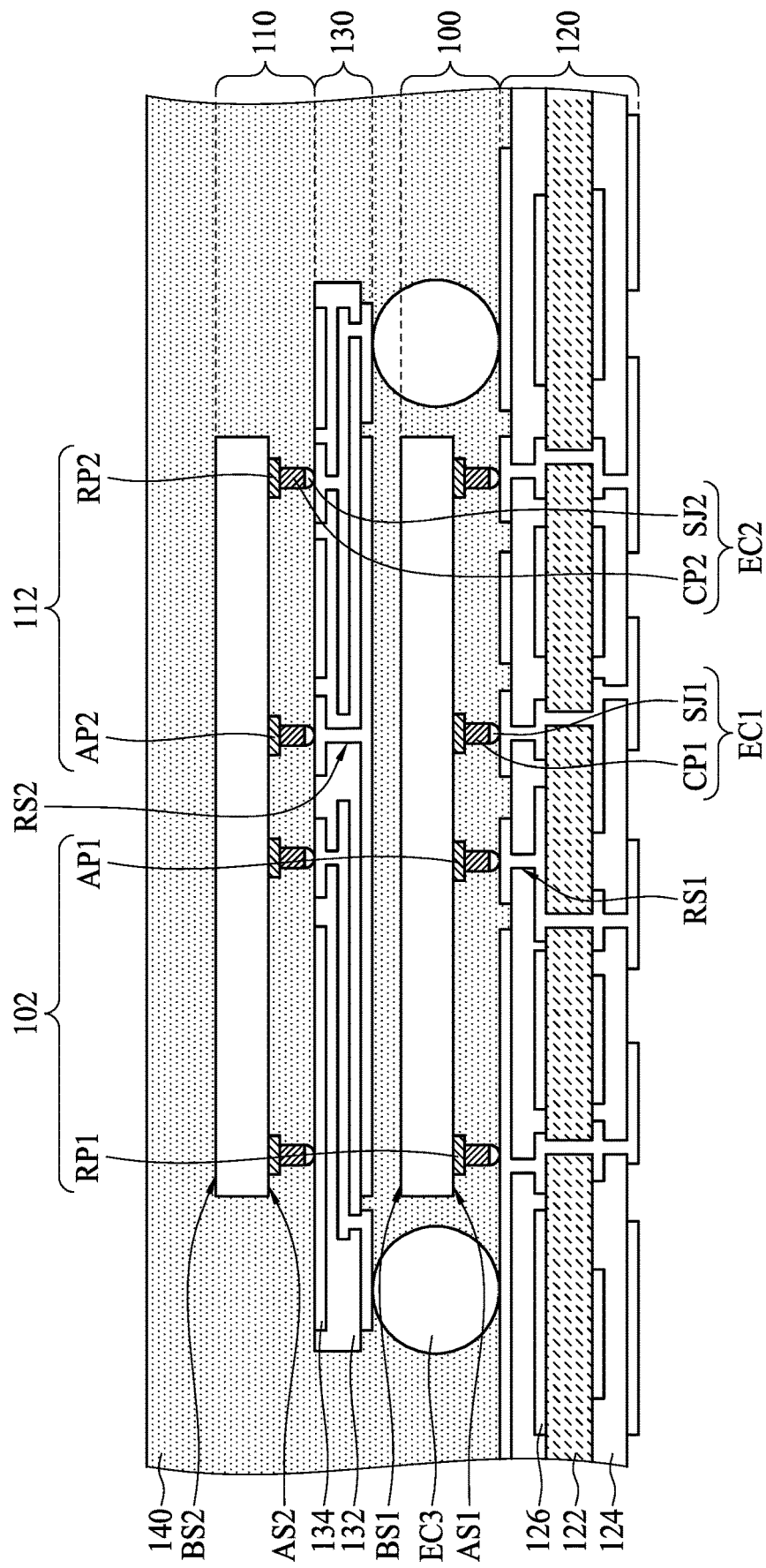

Referring to FIG. 3 and FIG. 4H, step S25 is performed, and the components bonded on the package substrate 120 are encapsulated by the encapsulant 140. In other words, the bottom device die 100, the top device die 110, the interposing package substrate 130 and the electrical connectors EC3 are encapsulated by the encapsulant 140. In some embodiments, a transfer-molding process, a compression-molding process or other viable molding process can be used for forming the encapsulant 140. In addition, in some embodiments, the encapsulant 140 may be subjected to a planarization process (e.g., a chemical mechanical polishing process), and the top device die 110 may still be buried in the encapsulant 140.

Figure 4I:
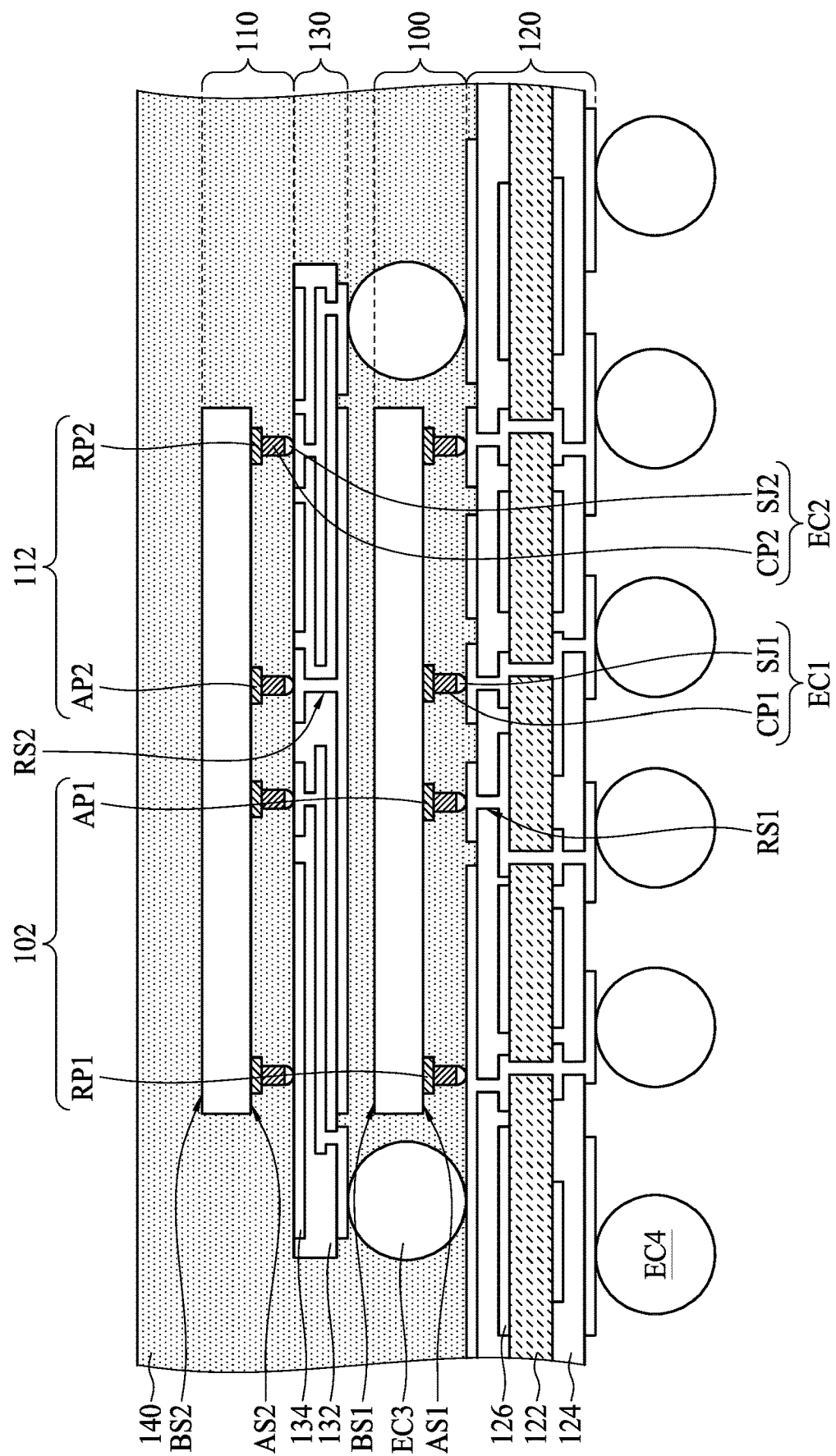

Referring to FIG. 3 and FIG. 4I, step S27 is performed, and the package I/Os EC4 are formed at a side of the package substrate 120 facing away from the bottom device die 100. In those embodiments where the package I/Os EC4 are BGA balls, a method for forming the package I/Os EC4 may include a ball placement process or a ball mount process.

Referring to FIG. 3 and FIG. 1, step S29 is performed, and the current structure is subjected to a package singulation process. One of the singulated structures is depicted in FIG. 1. In some embodiments, the package singulation process may include a blade sawing process, a plasma dicing process or the like. In the embodiments described above, the formation of the package I/Os EC4 precedes the package singulation process. However, in alternative embodiments, the package singulation process may be followed by the formation of the package I/Os EC4. The present disclosure is not limited to a sequential order of these two steps.

Up to here, the semiconductor package 10 is formed according to some embodiments. The semiconductor package 10 may further be subjected to other packaging process or test procedures.

Figure 5A:
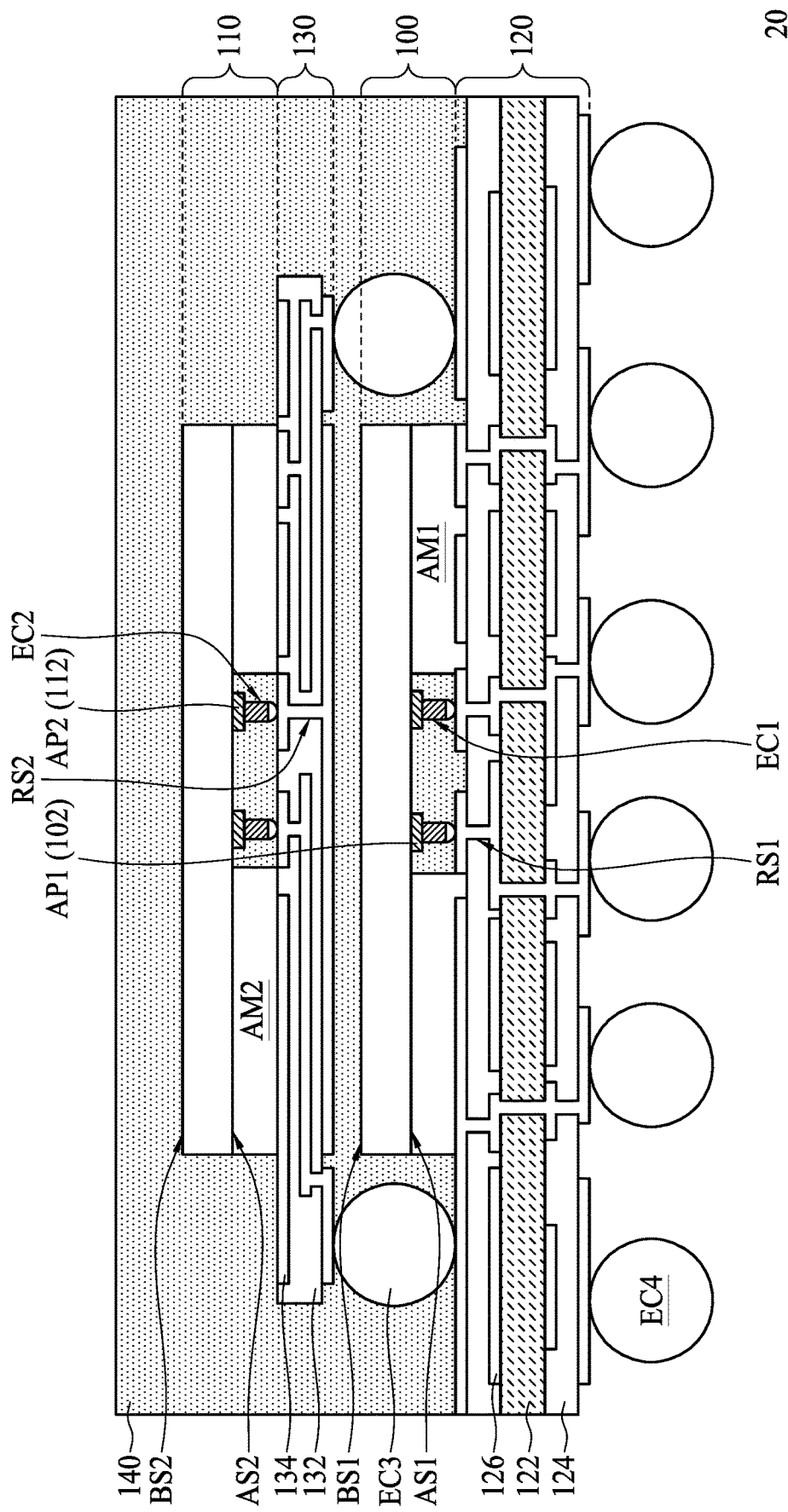
FIG. 5A is a schematic cross-sectional view illustrating a semiconductor package according to some embodiments of the present disclosure.
Figure 5B:
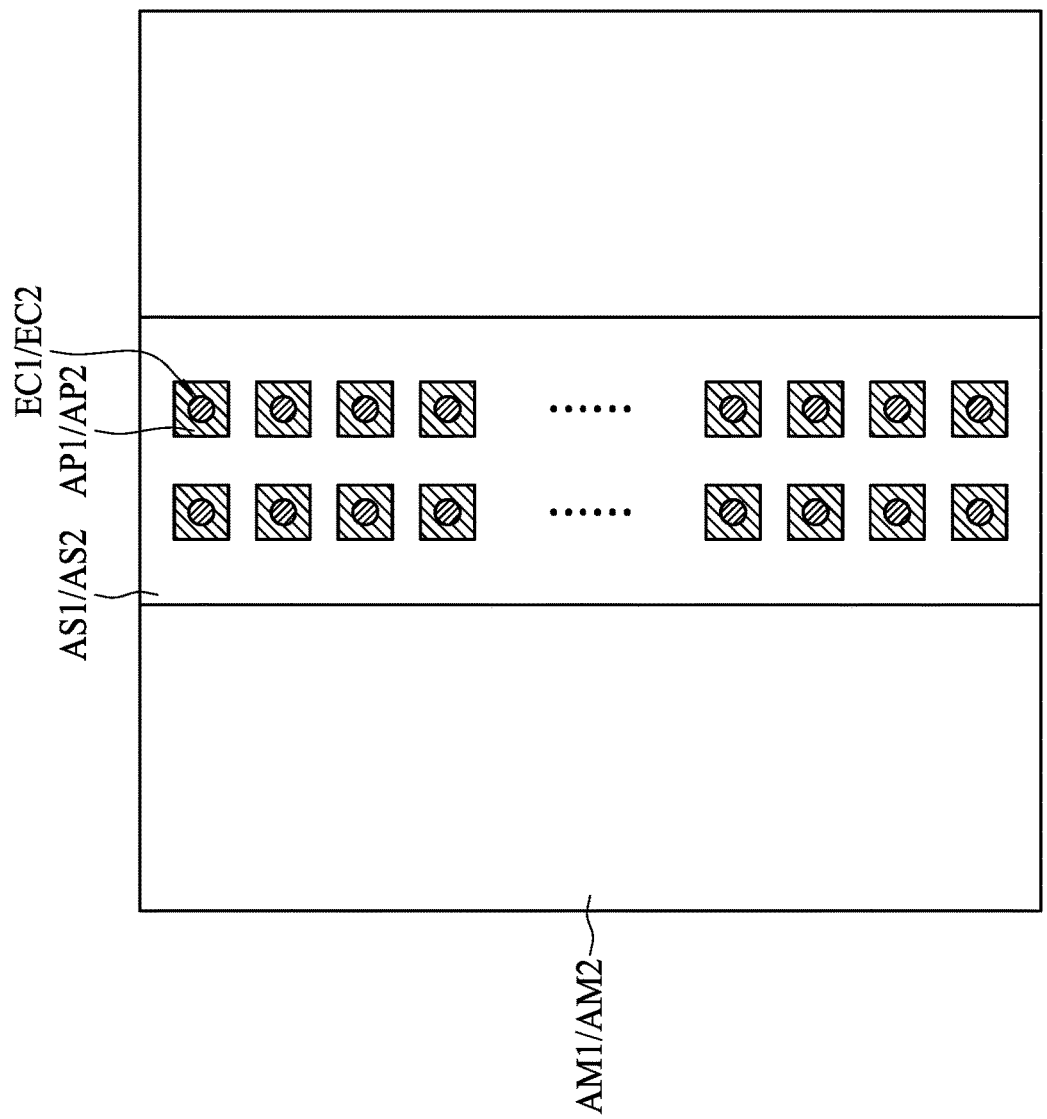
FIG. 5B is a schematic plan view illustrating an active side of each device die in the semiconductor package as shown in FIG. 5A.

FIG. 5A is a schematic cross-sectional view illustrating a semiconductor package 20 according to some embodiments of the present disclosure. FIG. 5B is a schematic plan view illustrating an active side of each device die in the semiconductor package 20 as shown in FIG. 5A. The semiconductor package 20 to be described with reference to FIG. 5A and FIG. 5B is similar to the semiconductor package 10 as shown in FIG. 1. Only differences therebetween will be discussed, the same or the like part would not be repeated again.

Referring to FIG. 5A and FIG. 5B, in some embodiments, the redistribution structures RD1, RD2 as described with reference to FIG. 1 and FIG. 2B are omitted. In these embodiments, the die I/Os 102 of the bottom device die 100 may merely include the conductive pads AP1, and the die I/Os 112 of the top device die 110 may merely include the conductive pads AP2. In addition, an adhesive material AM1 may be disposed between the bottom device die 100 and the package substrate 120. The adhesive material AM1 may not cover the entire active side AS1 of the bottom device die 100. In those embodiments where the conductive pads AP1 are formed within a central region of the active side AS1, the adhesive material AM1 may have two separate sub-portions, and the conductive pads AP1 may be located in a space between these separate sub-portions of the adhesive material AM1. Similarly, an adhesive material AM2 may be disposed between the top device die 110 and the interposing package substrate 130. In addition, the adhesive material AM2 may have two separate sub-portions, and the conductive pads AP2 of the top device die 110 may be located within a space between these two separate sub-portions of the adhesive material AM2.

Regarding a manufacturing process of the semiconductor package 20, the adhesive material AM1 may be dispensed on the package substrate 120 before the bottom device die 100 is bonded onto the package substrate 120. In addition, the adhesive material AM2 may be dispensed on the interposing package substrate 130 before the top device die 110 is bonded onto the interposing package substrate 130.

Figure 6A:
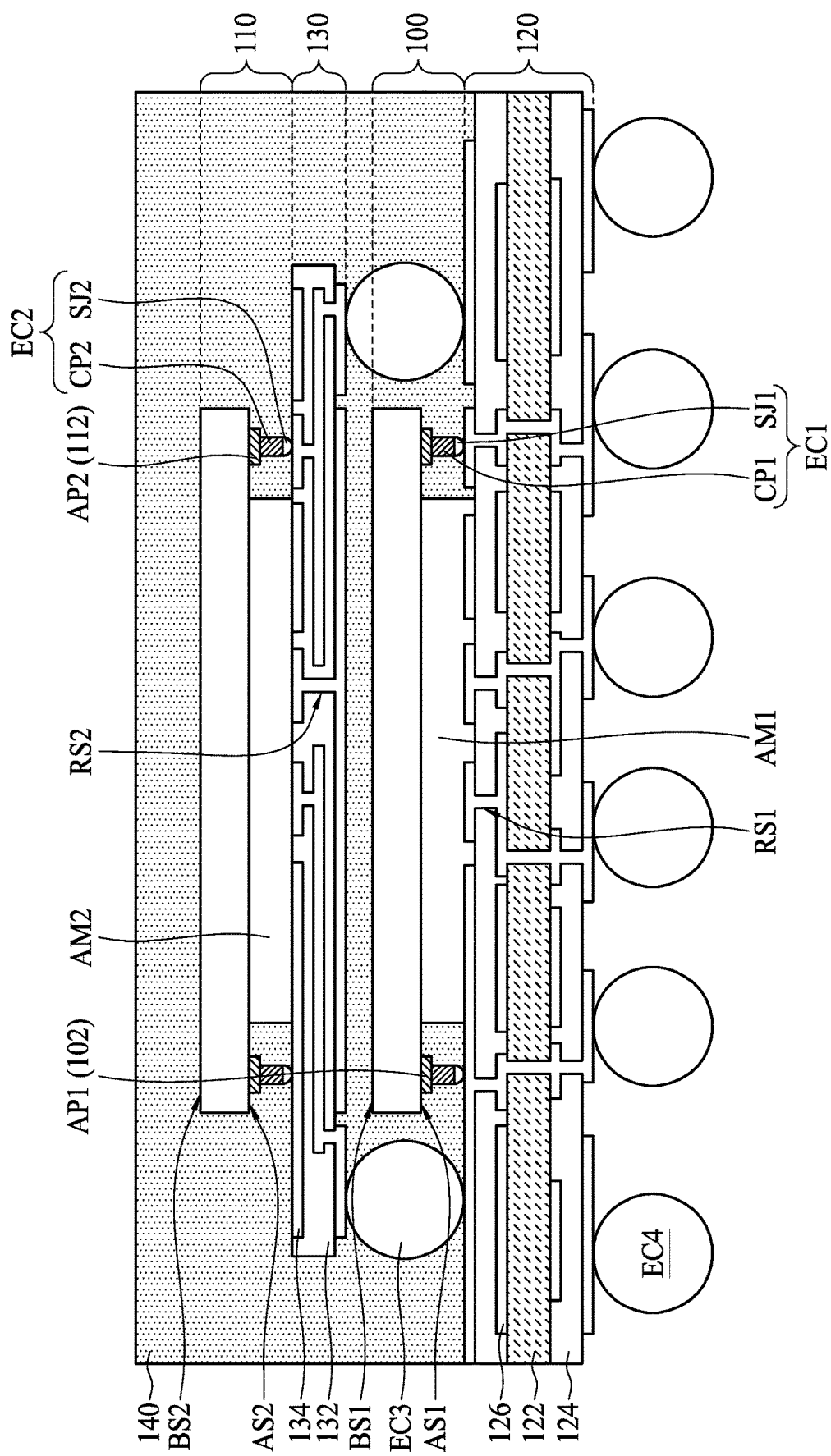
FIG. 6A is a schematic cross-sectional view illustrating a semiconductor package according to some embodiments of the present disclosure.
Figure 6B:
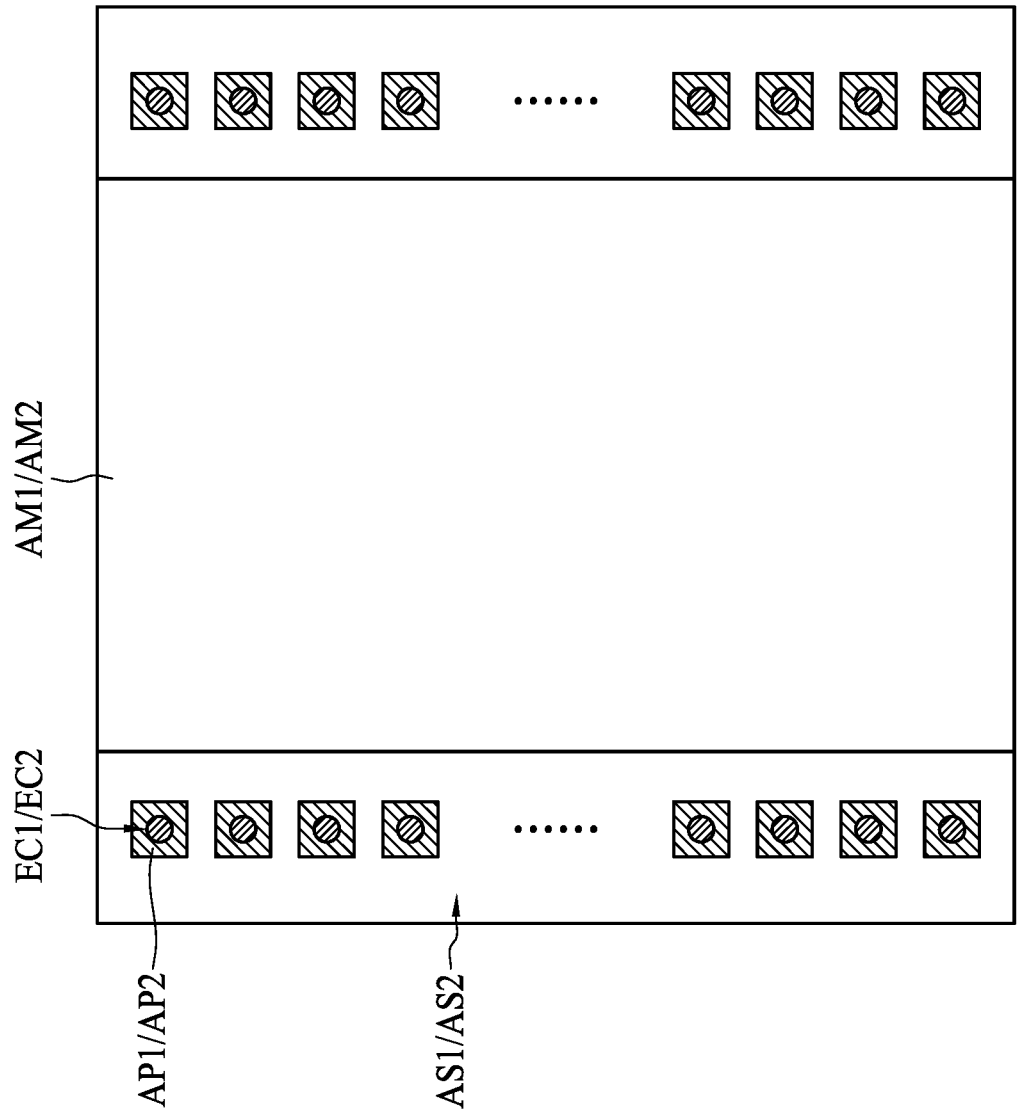
FIG. 6B is a schematic plan view illustrating an active side of each device die in the semiconductor package as shown in FIG. 6A.

FIG. 6A is a schematic cross-sectional view illustrating a semiconductor package 20a according to some embodiments of the present disclosure. FIG. 6B is a schematic plan view illustrating an active side of each device die in the semiconductor package 20a as shown in FIG. 6A. The semiconductor package 20a to be described with reference to FIG. 6A and FIG. 6B is similar to the semiconductor package 20 as shown in FIG. 5A and FIG. 5B. Only differences therebetween will be discussed, the same or the like part would not be repeated again.

Referring to FIG. 6A and FIG. 6B, in embodiments where the conductive pads AP1 are formed within a peripheral region of the active side AS1 of the bottom device die 100, the conductive pads AP1 may laterally surround the adhesive material AM1, or may be located at opposite sides of the adhesive material AM1. In addition, the adhesive material AM1 may be formed as a continuously spreading pattern, rather than being formed as having separate sub-portions. Similarly, in embodiments where the conductive pads AP2 are formed within a peripheral region of the active side AS2 of the top device die 110, the conductive pads AP2 may laterally surround the adhesive material AM2, or may be located at opposite sides of the adhesive material AM2. Moreover, the adhesive material AM2 may be formed as a continuously spreading pattern, rather than being formed as having separate sub-portions.

Figure 7:
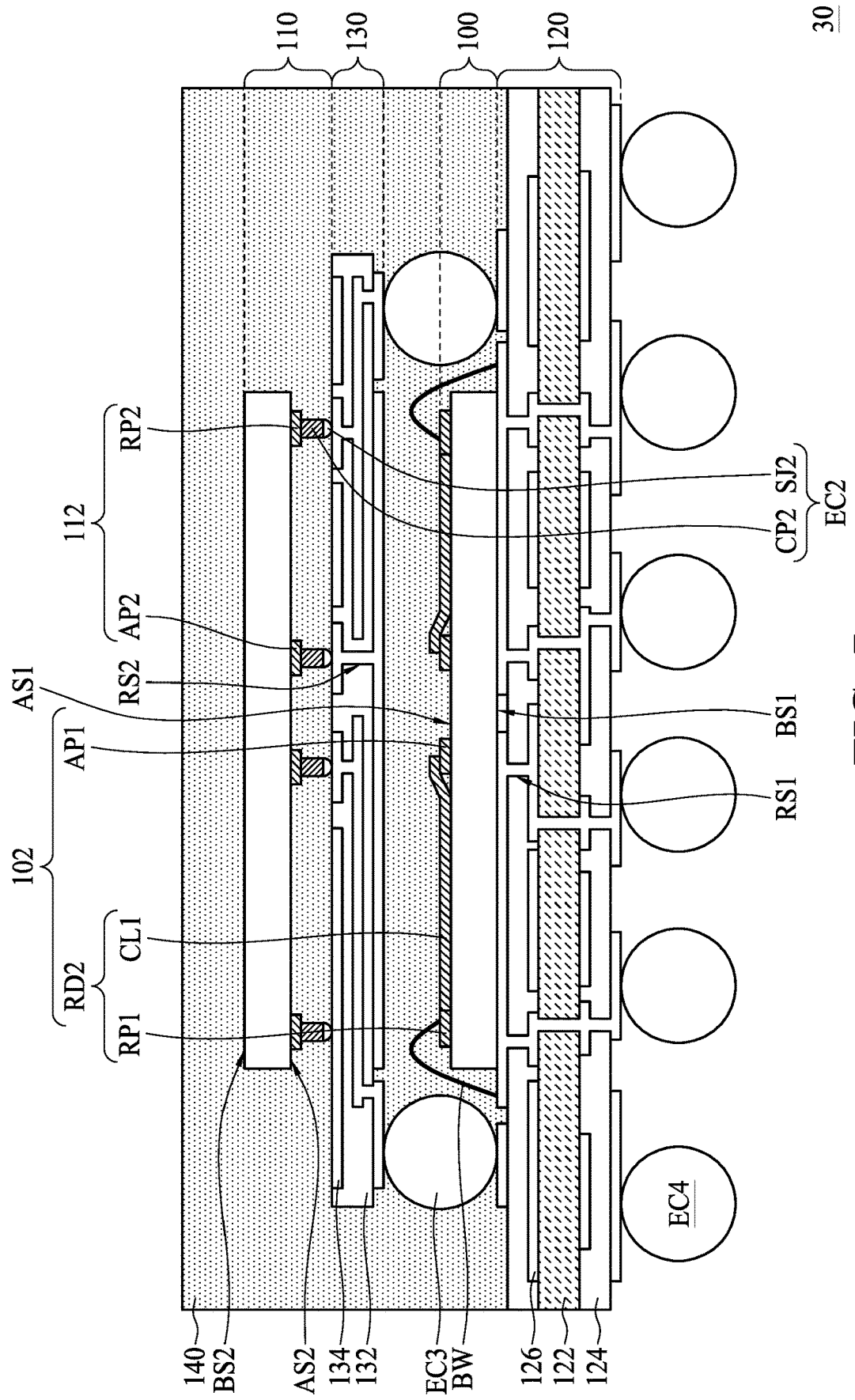
FIG. 7 is a schematic cross-sectional view illustrating a semiconductor package according to some embodiments of the present disclosure.
Figure 8A:
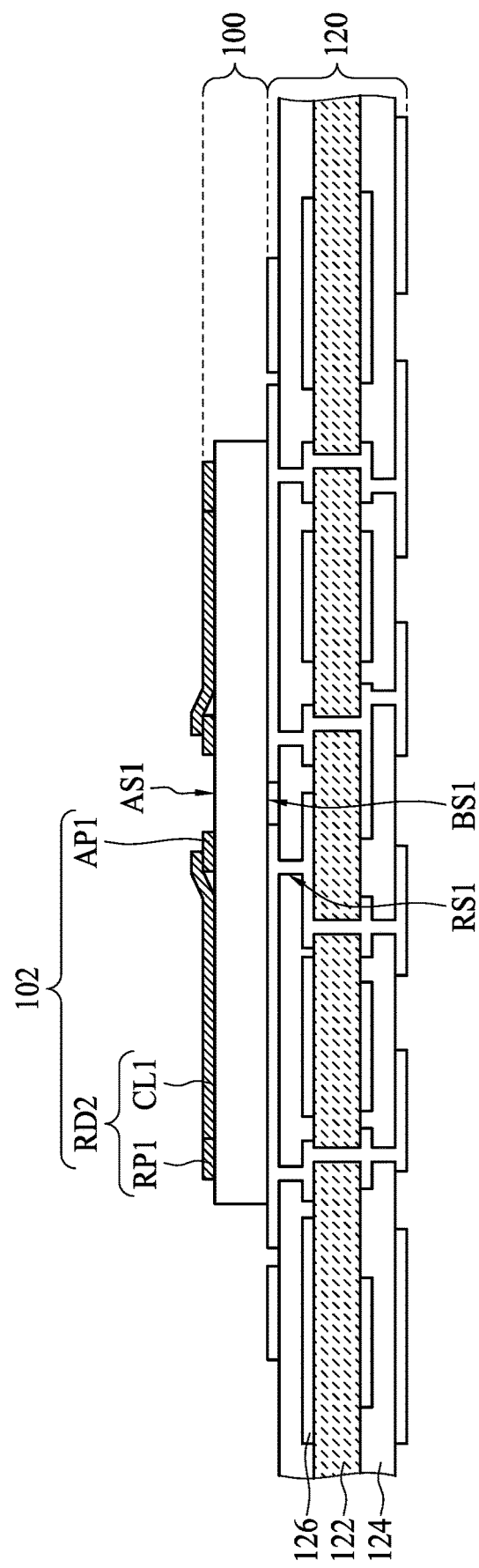
FIG. 8A and FIG. 8B illustrate a method for bonding the bottom device die onto the package substrate according to some embodiments of the present disclosure.
Figure 8B:
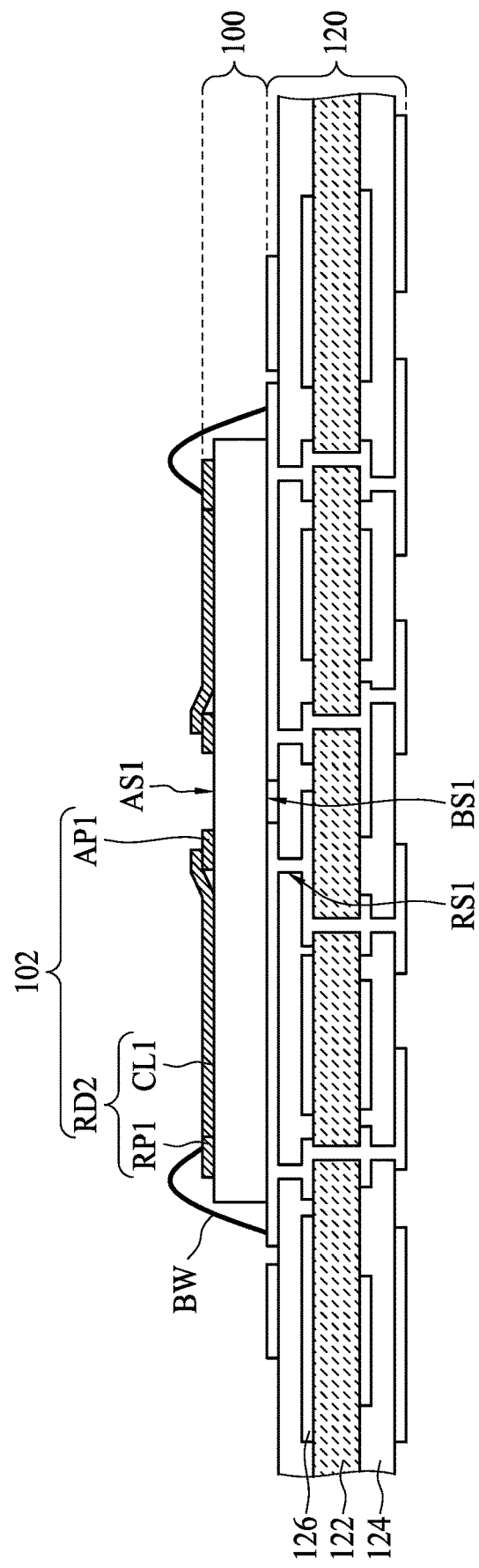

FIG. 7 is a schematic cross-sectional view illustrating a semiconductor package 30 according to some embodiments of the present disclosure. FIG. 8A and FIG. 8B illustrate a method for bonding the bottom device die 100 onto the package substrate 120 according to some embodiments of the present disclosure. The embodiments to be described with reference to FIG. 7, FIG. 8A and FIG. 8B is similar to the embodiments as described with reference to FIG. 1, FIG. 2A, FIG. 2B, FIG. 3 and FIG. 4A through FIG. 4I. Only differences therebetween will be discussed, the same or the like part would not be repeated again.

Referring to FIG. 7, in some embodiments, the bottom device die 100 is bonded onto the package substrate 120 via a wire bonding manner. In these embodiments, the back side BS1 of the bottom device die 100 is facing toward the package substrate 120, while the active side AS1 of the bottom device die 100 is facing away from the package substrate 120. In addition, bonding wires BW are formed for connecting some of the die I/Os 102 to the package substrate 120. For instance, the bonding wires BW are connecting between the redistribution pads RP1 and the package substrate 120.

Referring to FIG. 8A and FIG. 8B, in regarding a manufacturing process of the semiconductor package 30, the bonding wires BW are formed after the bottom device die 100 is attached onto the package substrate 120.

As above, the semiconductor package according to embodiments of the present disclosure is a dual-die semiconductor package, and includes the bottom device die and the top device die located over the bottom device die. The bottom device die is bonded to the package substrate. The top device die is bonded to the package substrate with the interposing package substrate in between. In addition, the interposing package substrate is located between the bottom device die and the top device die. Additional power plane and additional ground plane in the interposing package substrate can be provided for the top device die. As compared to the power plane and ground plane formed in the package substrate, these additional power plane and ground plane in the interposing package substrate are closer to the top device die. Therefore, power and reference voltages can be provided to the top device die by the interposing package substrate with fewer loss. Accordingly, performance of the top device die can be improved.

In an aspect of the present disclosure, a semiconductor package is provided. The semiconductor package comprises: a package substrate; a bottom device die, bonded to the package substrate; an interposing package substrate, located over the bottom device die and bonded to the package substrate; and a top device die, bonded to the interposing package substrate from above the interposing package substrate.

In another aspect of the present disclosure, a semiconductor package is provided. The semiconductor package comprises: a package substrate; a bottom device die, bonded to the package substrate; an interposing package substrate, located over the bottom device die, wherein a peripheral portion of the interposing package substrate is bonded to the package substrate, and a footprint area of the interposing package substrate is larger than a footprint area of the bottom device die and smaller than a footprint area of the package substrate; and a top device die, bonded onto the interposing package substrate.

In yet another aspect of the present disclosure, a manufacturing method of a semiconductor package is provided. The manufacturing method of the semiconductor package comprises: bonding a bottom device die onto a package substrate; bonding a top device die onto an interposing package substrate; and bonding the interposing package substrate along with the top device die onto the package substrate, wherein the bonded interposing package substrate is located between the bottom device die and the top device die.

By disposing the interposing package substrate, additional power plane and additional ground plane can be provided to the top device die. As compared to the power plane and ground plane formed in the package substrate, these additional power plane and ground plane in the interposing package substrate are closer to the top device die. Therefore, power and reference voltages can be provided to the top device die by the interposing package substrate with fewer loss. Accordingly, performance of the top device die can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor package, comprising:
    a package substrate;
    a bottom device die, bonded to the package substrate;
    an interposing package substrate, located over the bottom device die and bonded to the package substrate;
    a top device die, bonded to the interposing package substrate from above the interposing package substrate;
    first conductive pillars, disposed between the bottom device die and the package substrate; and
    second conductive pillars, disposed between the top device die and the interposing package substrate.

2. The semiconductor package according to claim 1, wherein the package substrate is bonded with a peripheral portion of the interposing package substrate.

3. The semiconductor package according to claim 1, wherein the interposing package substrate is vertically spaced apart from the bottom device die.

4. The semiconductor package according to claim 1, further comprising:
    electrical connectors, connecting between a peripheral portion of the interposing package substrate and the package substrate.

5. The semiconductor package according to claim 4, wherein the bottom device die is located between laterally separated ones of the electrical connectors.

6. The semiconductor package according to claim 4, wherein the electrical connectors are laterally spaced apart from the bottom device die.

7. The semiconductor package according to claim 4, wherein a height of the electrical connectors is greater than a height measured from a top surface of the bottom device die to a top surface of the package substrate.

8. The semiconductor package according to claim 4, wherein the electrical connectors are ball-grid-array (BGA) balls or controlled-collapse-chip-connection (C4) bumps.

9. The semiconductor package according to claim 1, further comprising:
   an encapsulant, encapsulating the bottom device die, the interposing package substrate and the top device die.

10. The semiconductor package according to claim 9, wherein a space between the bottom device die and the interposing package substrate is filled by the encapsulant.

11. The semiconductor package according to claim 1, further comprising:
   additional electrical connectors, disposed at a bottom side of the package substrate.

* * * * *